United States Patent [19]

Hush et al.

[11] Patent Number: 5,128,563
[45] Date of Patent: Jul. 7, 1992

[54] CMOS BOOTSTRAPPED OUTPUT DRIVER METHOD AND CIRCUIT

[75] Inventors: Glen Hush; Mark R. Thomann, both of Boise, Id.

[73] Assignee: Micron Technology, Inc., Boise, Id.

[21] Appl. No.: 619,164

[22] Filed: Nov. 28, 1990

[51] Int. Cl.⁵ ............................................ H03K 17/16
[52] U.S. Cl. .............................. 307/482; 307/443; 307/263; 307/451; 307/578
[58] Field of Search ............... 307/482, 578, 452, 481, 307/443, 263, 451

[56] References Cited

U.S. PATENT DOCUMENTS

| | | | |
|---|---|---|---|
| 4,689,505 | 8/1987 | Ghoshal | 307/578 |
| 4,692,638 | 9/1987 | Stiegler | 307/578 |
| 4,772,812 | 9/1988 | Desmarais | 307/482 |
| 4,806,798 | 2/1989 | Kanauchi | 307/482 |
| 4,894,559 | 1/1950 | Kaneko | 307/578 |
| 4,983,860 | 1/1991 | Yim et al. | 307/481 |

Primary Examiner—Stanley D. Miller
Assistant Examiner—Scott A. Ouellette
Attorney, Agent, or Firm—Susan B. Collier

[57] ABSTRACT

An output driver circuit of a DRAM is wired in a push-pull arrangement. A CMOS transistor arrangement provides a strong output signal. This transistor arrangement comprises the pull-up transistor circuit of the push-pull arrangement. A bootstrap circuit gates the NMOS of the CMOS causing an incremental increase in CMOS drain current.

41 Claims, 3 Drawing Sheets

CMOS BOOTSTRAPPED OUTPUT DRIVER METHOD AND CIRCUIT

FIELD OF THE INVENTION

This invention relates to electronic circuits used to provide signal outputs at desired potentials. These circuits are of interest on semiconductor integrated circuits. More particularly, the invention relates to the output driver circuit of a dynamic random access memory device (DRAM.)

BACKGROUND OF THE INVENTION

A (DRAM) stores digital data in an array of memory cells. Each memory cell has a specific address which is essentially the intersection formed by a wordline and a digit line. Once an individual cell has been selected, its true data is amplified and latched onto its digit line by a sense amp. The same sense amp also amplifies and latches the cell's complementary data onto another digit line. Thus, one digit line is high, usually approaching $V_{cc}$, and the other digit line is low, 0 volts.

Figure 1A:
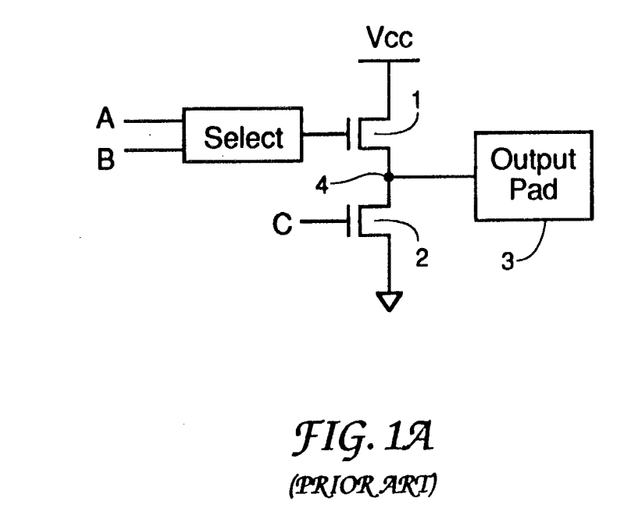
FIGS. 1A and 1B are prior art depictions of typical push-pull configurations of a typical output driver circuit.
Figure 1B:
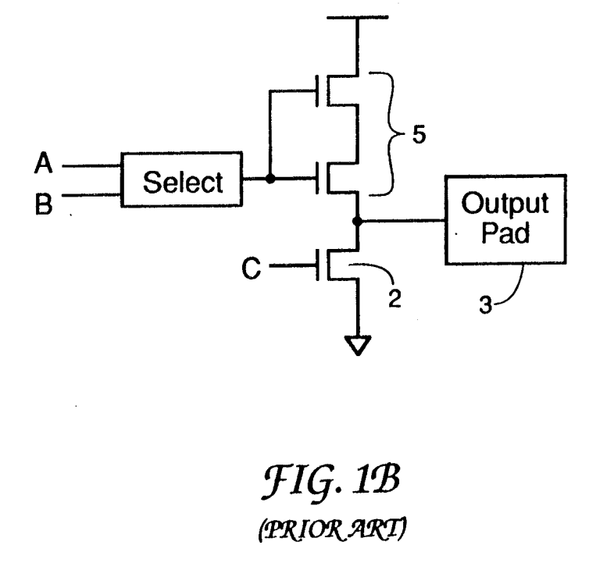

It is necessary to transfer the data from the digit lines to the output. This data transfer is accomplished by incorporating an output driver circuit into the DRAM. The output driver normally consists of two serially connected NMOS transistors wired in a push-pull arrangement as in FIG. 1A, where A is the data and B is A's complement. C is a control signal. The drain of the pull-up transistor 1 is connected to $V_{cc}$, the source of the pull-down transistor 2 is connected to ground with the output pad 3 connected in parallel from the serial connection 4 to ground. The push-pull arrangement is conducive to low distortion, large load power and high efficiency. A second option for a push-pull circuit configuration is the three serially connected NMOS transistor arrangement shown in FIG. 1B. In this case the output pad 3 remains in parallel with the grounded pull-down transistor 2 and the two upper transistors 5 constitute the pull-up transistor. There are problems encountered in either arrangement. First it is necessary to use large pull up transistors for a total size in the range of 4500 microns. These large transistors require more space. Further, the use of NMOS transistors makes the circuit subject to negative input injection. Large initial drain currents in an output driver circuit are also noise conducive.

SUMMARY OF THE INVENTION

In the preferred embodiment the pull-up transistor of the push-pull arrangement of the DRAM output driver circuit is implemented with a CMOS device, the gates of the CMOS receiving inverted signals insuring that both complementary transistors have the same on-off state. The CMOS comprises a PMOS directly connected to $V_{cc}$ at its drain and an NMOS connected from its source to the drain of an NMOS pull-down transistor. This CMOS design utilizes a 2000 micron PMOS device and a 500 micron NMOS device effecting a considerable die space savings over the conventional NMOS push-pull arrangement. The NMOS transistor of the CMOS is gated by a bootstrapped circuit that initially gates at approximately 5 volts with a subsequent increase to approximately 7 volts. The bootstrap circuit reduces noise due to the two level gate voltage which directly results in a two level drain current. A large initial current is more susceptible to noise than the incremental current increase of the present embodiment. Since a negative input voltage on the output pad will not turn on the PMOS transistor of the CMOS as it can the NMOS transistors of the prior art, there is no negative input injection.

DETAILED DESCRIPTION OF THE PREFERRED EMBODIMENT

Figure 2:
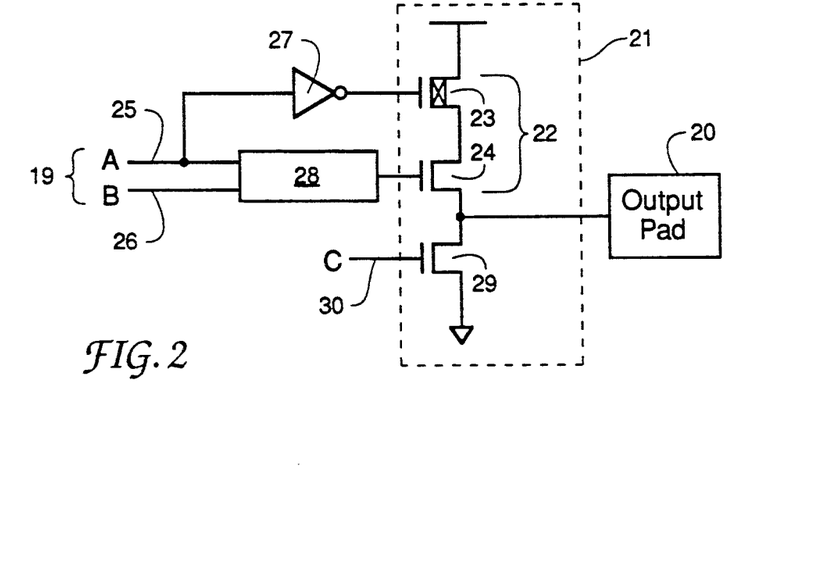
FIG. 2 is a simplified block schematic of the push-pull configuration of the output driver circuit of the present embodiment.

The preferred embodiment of the present invention is an output driver circuit shown simplified in the block schematic of FIG. 2. The preferred embodiment efficiently transfers data from the digit lines 19 of a DRAM to the output pad 20. A push-pull transistor configuration 21 buffers the data to the output to ensure low distortion, high efficiency, and large load power. The pull-up transistor is a CMOS transistor arrangement 22 comprising a PMOS transistor 23 serially connected to an NMOS transistor 24. The use of the CMOS transistor arrangement enhances the circuit by eliminating negative input injection and utilizing smaller transistors. This enhancement is directly a result of the PMOS transistor. The PMOS and the NMOS comprising the CMOS receive complementary gate signals to ensure identical on-off transistor states. The input signal at A 25 represents the selected cell's data. The inverse signal at B 26 represents the data's complement. Input inverse signal 26 gate the CMOS. The PMOS transistor of the CMOS is gated by the input signal through an inverter 27 and the NMOS transistor of the CMOS is gated by the input signal and the inverse signal through the bootstrap circuit 28 configuration. The bootstrap circuit 28 gates the NMO transistor of the CMOS in at least two incremental steps in order to reduce noise. The PMOS of the CMOS is connected to $V_{cc}$ at its drain and the NMOS of the CMOS is connected at its source to the drain of the NMOS pull-down transistor 29. The pull-down transistor is gated by the control signal C 30. A high input signal is transferred to the output by a low control signal, and a low input signal is transferred to the output by a high control signal. The output is at a high impedance when both the input signal and the control signal are low.

Figure 3:
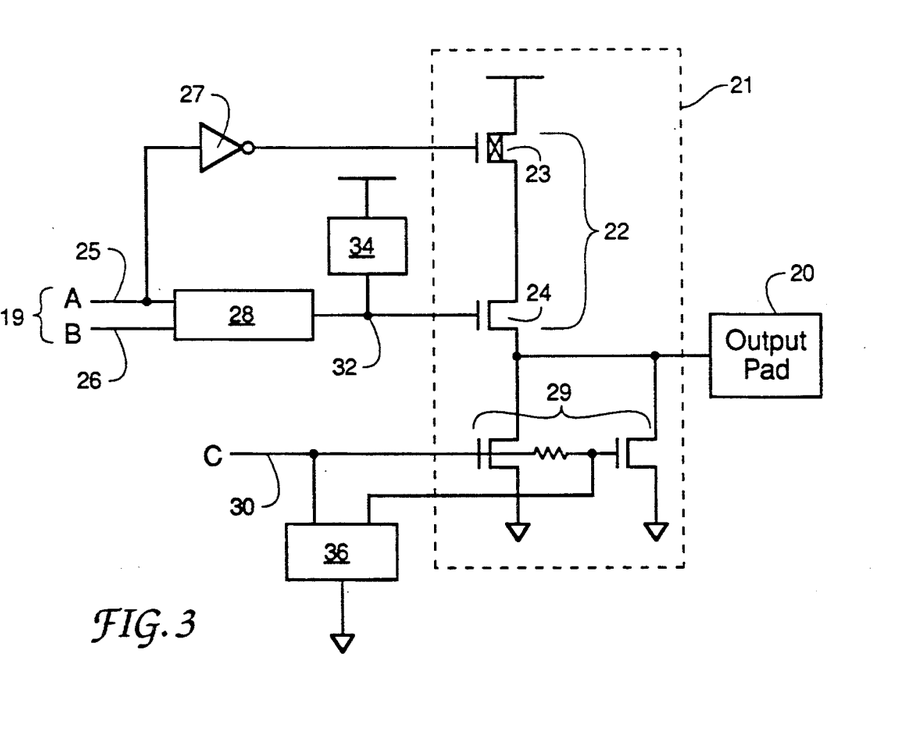
FIG. 3 is a block schematic of the push-pull configuration of the output driver circuit of the present embodiment.

FIG. 3 is a more sophisticated block diagram of the preferred embodiment. A high logic level on the gate node 32 is held high by the pull-up circuit 34 and a low logic level control signal 30 is held low by a pull-down circuit 36. The pull-down transistor 29 may actually be at least two parallel NMOS transistors.

Figure 4:
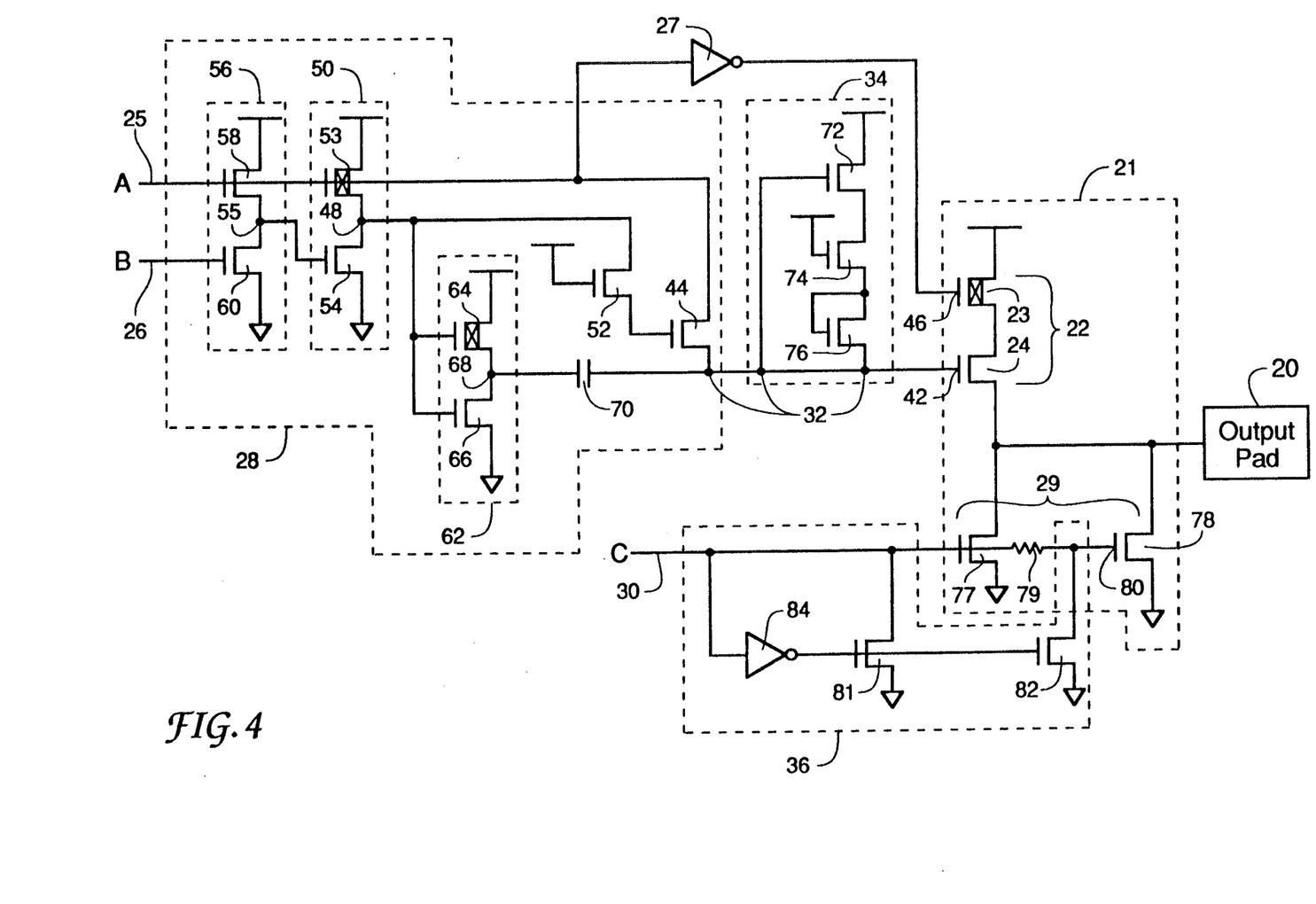
FIG. 4 is a detailed schematic of the push-pull configuration of the output driver circuit of the present embodiment.

The bootstrap configuration 28 of FIG. 3 is shown in more detail in FIG. 4. Gate node 32 activates the gate 42 of NMOS 24. The bootstrap configuration passes a low to the gate node 32 through switching NMOS transistor 44 when the input signal 2 is low and the inverse signal 26 is high. This low at gate 42 turns off transistor 24. The low input signal is inverted through inverter 27 to pass a high to the gate 46 of transistor 23 turning it off. Switching NMOS transistor 44 is gated by a signal from the serial connection output 48 of a subsequent MOS transistor pair 50 through a continually gated NMOS transistor 52. The subsequent MOS transistor pair comprises a PMOS 53 and an NMOS 54 serially connected at the serial connection output 48. The PMOS 53 drain is connected to $V_{cc}$, and the NMOS 54 source is connected to ground. The PMOS 53 is gated directly from the input signal 25. The NMOS 54 is gated from the serial output 55 of an initial NMOS transistor pair 56 having a first initial NMOS transistor 58 whose drain is connected to $V_{cc}$ and having a second initial NMOS transistor 60 whose source is connected to ground. First initial NMOS transistor 58 is gated by input signal 25 and second initial NMOS transistor 60 is gated by the inverse signal 26. A low on the input signal 25 turns off the first initial NMOS transistor 58 and a high on the inverse signal 26 turns on the second initial NMOS transistor 60 taking the serial output 55 low. The low on the serial output 55 turns off the NMOS 54 and the low on the input signal 25 turns on the PMOS transistor 53 taking the serial connection output 48 high. The high serial connection output 48 then passes through the continually gated NMOS transistor 52 to gate the switching NMOS transistor 44. Thus, the low input signal is passed through the switching NMOS transistor 44 to the gate node 32.

In addition to gating the switching transistor 44, the serial connection output 48 gates a commonly gated MOS transistor pair 62. The commonly gated MOS transistor pair 62 consists of a PMOS transistor 64 and an NMOS transistor 66 serially connected at a serial node 68. The PMOS 64 and the NMOS 66 have opposite on-off states. The PMOS 64 drain is connected to $V_{cc}$ and the NMOS 66 source is connected to ground. A capacitor 70 is connected between the serial node 68 and the gate node 32. When the input signal 25 is low, the gate node 32 is low and the serial node 68 is low. The low input signal causes the serial node to go low by passing a high to the gate of NMOS transistor 66 turning it on and shorting the serial node 68 to ground. The identical low potentials seen by the capacitor 70 keep it from charging.

When the input signal fires from a low to a high, the switching transistor 44 remains on and the high is felt at the gate node 32. The serial node 68 remains low during a three gate time delay and the capacitor charges. The high seen on the gate node 32 turns on the NMOS 24 of the CMOS transistor arrangement 22. The high input signal is also inverted at the inverter 27 turning on the PMOS 23 of said CMOS transistor arrangement 22. The high input signal turns on first initial NMOS transistor 58 allowing a high on the gate of transistor 54. NMOS Transistor 54 turns on, taking the serial connection output 48 to a low. The low is passed through the continually gated transistor 52 to turn off the switching transistor 44, thus isolating the high on the gate node after a delay time due to the on-off change of state of three transistors.

The low at the serial connection output 48 due to the high input signal turns on PMOS transistor 64, thus taking the serial node 68 high after a time delay equal to the time it took for three transistors to change on-off states. The high on the serial node 68 coupled with the high on the gate node 32 boots the capacitor 70 to a higher potential, approximately 7 volts. This increase in potential on the capacitor results in a corresponding increase in potential on the gate node 32. Transistor 24 is bootstrapped to the capacitor potential. That is, since the gate node potential follows the capacitor potential, the transistor is turned on harder with an increase in capacitor potential, meaning it is made to conduct more drain current than would be possible if the increase in potential were not present. PMOS transistor 23 remains on due to the inverted high input signal. Since the drain current increases incrementally, the circuit is subject to considerably less noise than if the current were to go high initially.

An NMOS transistor 72 is gated by the gate node 32 and is connected to $V_{cc}$ at its drain. The NMOS transistor 72 is serially connected at its source to the drain of a continuously gated NMOS transistor 74. The continuously gated NMOS transistor 74 in turn is connected serially from its source to a diode 76. A high on the gate node 32 turns on the transistor 72, pulling the gate node 32 to a high $V_{cc}$ through the diode 76, the continuously gated NMOS transistor 74, and the NMOS transistor 72. The transistors 72 and 74 and diode 76 constitute the pull-up device 34.

In the preferred embodiment two parallel NMOS transistors 77 and 78 comprise pull-down transistor 29. NMOS transistor 77 is gated directly by the control signal 30 and NMOS transistor 78 is gated by the control signal 30 through a resistor 79 connected serially between the gate 80 of the transistor 78 and the control signal 30. The drains of the NMOS transistors 77 and 78 are connected to the source of the CMOS pull-up transistor 22. The sources of the NMOS transistors 77 and 78 are connected to ground.

Two parallel NMOS transistors 81 and 82, and inverter 84 comprise a pull-down device 36. The NMOS transistors 80 and 81 are connected to the control signal 30 at their drains and to ground at their sources. A low on the control signal 30 is inverted to the gates of the NMOS transistors 78 and 80, turning them on and keeping the control signal low.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

We claim:

1. An output driver circuit having an output pad, digital circuit inputs comprising an input signal, an inverse signal of said input signal, a control signal, and supply and ground nodes, said supply and ground nodes connectable to supply and ground potentials respectively, said digital circuit inputs having high and low logic levels, wherein the output driver circuit comprises:

a) a push-pull transistor configuration having a pull-up transistor circuit connectable to said supply potential, said pull-up transistor circuit being a CMOS transistor arrangement, said CMOS transistor arrangement comprising serially connected NMOS and PMOS transistors, the PMOS transistor being gated by the input signal after inversion of the input signal through an inverter, the NMOS transistor gated in at least two increments by a bootstrapped configuration at a gate node, said bootstrapped configuration accepting the input signal and the inverse signal such that the NMOS and the PMOS of said CMOS receive complementary gate signals resulting in duplicate switching wherein both transistors are off when the input signal has said low logic level and both transistors are on when the input signal has said high logic level;

b) a pull-down transistor connectable to said ground potential, said pull-down transistor being an NMOS having a drain connected serially at said series connection to a source of the NMOS of said CMOS transistor arrangement and having its source connectable to said ground potential, the NMOS of said pull-down transistor gated by said control signal such that a high logic level control signal transfers a low logic level input signal to the output pad and a low logic level control signal transfers a high impedance to the output pad when said input signal has said low logic level and transfers said high logic level to the output pad when said input signal has said high logic level, said pull-up and pull-down transistors having a series connection, the output pad connected in parallel with said pull-down transistor from said series connection to said ground potential; and c) said pull-down transistor further comprises at least two parallel connected NMOS, said parallel connected NMOS having a common source at said ground potential and a common drain at said series connection and being gated by said control signal.

2. An output driver circuit having an output pad, digital circuit inputs comprising an input signal, an inverse signal of said input signal, a control signal, and supply and ground nodes, said supply and ground nodes connectable to supply and ground potentials respectively, said digital circuit inputs having high and low logic levels, wherein the output driver circuit comprises:

a) a push-pull transistor configuration having a pull-up transistor circuit connectable to said supply potential, said pull-up transistor circuit being a CMOS transistor arrangement, said CMOS transistor arrangement comprising serially connected NMOS and PMOS transistors, the PMOS transistor being gated by the input signal after inversion of the input signal through an inverter, the NMOS transistor gated in at least two increments by a bootstrapped configuration at a gate node, said bootstrapped configuration accepting the input signal and the inverse signal such that the NMOS and the PMOS of said CMOS receive complementary gate signals resulting in duplicate switching wherein both transistors are off when the input signal has said low logic level and both transistors are on when the input signal has said high logic level;

b) a pull-down transistor connectable to said ground potential, said pull-down transistor being an NMOS having a drain connected serially at said series connection to a source of the NMOS of said CMOS transistor arrangement and having a source connectable to said ground potential, the NMOS of said pull-down transistor gated by said control signal such that a high logic level control signal transfers a low logic level input signal to the output pad and a low logic level control signal transfers a high impedance to the output pad when said input signal has said low logic level and transfers said high logic level to the output pad when said input signal has said high logic level, said pull-up and pull-down transistors having a series connection, the output pad connected in parallel with said pull-down transistor from said series connection to said ground potential; and c) an initial NMOS transistor pair connected serially at a serial output, having a first initial NMOS transistor gated by the input signal and a second initial NMOS transistor gated by an inverse of the input signal, said first initial NMOS transistor connectable to said supply potential at a drain, and said second initial NMOS transistor connectable to said ground potential at a source, said initial NMOS transistor pair having opposite on-off states, said high logic level on said input signal resulting in a high at said serial output, said low logic level on said input signal resettling in said low logic level at said serial output;

d) a subsequent MOS transistor pair having a PMOS and an NMOS serially connected at a serial connection output, said PMOS connectable to said supply potential at a drain and said NMOS connectable to said ground potential at a source, the NMOS of said subsequent MOS transistors pair directly gated by said serial output and the PMOS of said subsequent MOS transistor pair directly gated by said input signal, the MPOS and the NMOS of said subsequent transistor pair having opposite on-off states resulting in said high logic level at said serial connection output when the input signal has said low logic level and said low logic level at the serial connection output when the input signal has said high logic level;

e) a commonly gated MOS transistor pair serially connected at a serial node having a PMOS transistor connectable to said supply potential at a drain and an NMOS transistor connectable to said ground potential at a source, the PMOS and the NMOS of said commonly gated MOS transistor pair having opposite on-off states resulting in said high logic level at said serial node when said serial connecting output has said low logic level and resulting in said low logic level when said serial connection output has said high logic level, said serial connection output directly connected to the gates of said commonly gated MOS transistor pair;

f) a switching NMOS transistor connected between the input signal and said gate node, said serial connection output gating said switching NMOS transistor through a continually gated NMOS transistor, said switching NMOS transistor transferring the input signal to said gate node when closed and isolating said gate node from the input signal when open; and g) a capacitor connected between said serial node and said gate node, said capacitor receiving an initial low logic level at said gate node through said switching transistor and said low logic level at said serial node when the input signal has said low logic level, said capacitor remaining at said low logic level at said serial node and going high at said gate node upon an initial firing of the input signal from said low logic level to said high logic level, said high logic level transferred to said gate node through said switching transistor, said capacitor charging to said high logic level, said gate node gating the NMOS of said CMOS, said initial firing causing said switching transistor to open after a three gate time delay, said opening isolating said gate node from the input signal, said serial node going to said high logic level after a three gate time delay after said initial firing, said high logic level boosting said capacitor to a higher potential, the NMOS of said CMOS turning on harder.

3. An output driver circuit having an output pad, digital circuit inputs comprising an input signal, an inverse signal of said input signal, a control signal, and supply and ground nodes, said supply and ground nodes connectable to supply and ground potentials respectively, said digital circuit inputs having high and low logic levels, wherein the output driver circuit comprises:

a) a push-pull transistor configuration having a pull-up transistor circuit connectable to said supply potential, said pull-up transistor circuit being a CMOS transistor arrangement, said CMOS transistor arrangement comprising serially connected NMOS and PMOS transistors, the PMOS transistor being gated by the input signal after inversion of the input signal through an inverter, the NMOS transistor gated in at least two increments by a bootstrapped configuration at a gate node, said bootstrapped configuration accepting the input signal and the inverse signal such that the NMOS and the PMOS of said CMOS receive complementary gate signals resulting in duplicate switching wherein both transistors are off when the input signal has said low logic level and both transistors are on when the input signal has said high logic level;

b) a pull-down transistor connectable to said ground potential, said pull-down transistor being an NMOS having a drain connected serially at said series connection to a source of the NMOS of said CMOS transistor arrangement and having a source connectable to said ground potential, the NMOS of said pull-down transistor gated by said control signal such that a high logic level control signal transfers a low logic level input signal to the output pad and a low logic level control signal transfers a high impedance to the output pad when said input signal has said low logic level and transfers said high logic level to the output pad when said input signal has said high logic level, said pull-up and pull-down transistors having a series connection, the output pad connected in parallel with said pull-down transistor from said series connection to said ground potential; and c) a pull-up device for pulling said gate node to said high logic level.

4. An output driver circuit having an output pad, digital circuit inputs comprising an input signal, an inverse signal of said input signal, a control signal, and supply and ground nodes, said supply and ground nodes connectable to supply and ground potentials respectively, said digital circuit inputs having high and low logic levels, wherein the output driver circuit comprises:

a) a push-pull transistor configuration having a pull-up transistor circuit connectable to said supply potential, said pull-up transistor circuit being a CMOS transistor arrangement, said CMOS transistor arrangement comprising serially connected NMOS and PMOS transistors, the PMOS transistor being gated by the input signal after inversion of the input signal through an inverter, the NMOS transistor gated in at least two increments by a bootstrapped configuration at a gate node, said bootstrapped configuration accepting the input signal and the inverse signal such that the NMOS and the PMOS of said CMOS receive complementary gate signals resulting in duplicate switching wherein both transistors are off when the input signal has said low logic level and both transistors are on when the input signal has said high logic level;

b) a pull-down transistor connectable to said ground potential, said pull-down transistor being an NMOS having a drain connected serially at said series connection to a source of the NMOS of said CMOS transistor arrangement and having a source connectable to said ground potential, the NMOS of said pull-down transistor gated by said control signal such that a high logic level control signal transfers a low logic level input signal to the output pad and a low logic level control signal transfers a high impedance to the output pad when said input signal has said low logic level and transfers said high logic level to the output pad when said input signal has said high logic level, said pull-up and pull-down transistors having a series connection, the output pad connected in parallel with said pull-down transistor from said series connection to said ground potential; and c) a pull-down device for pulling said control signal to said low logic level.

5. A method of driving an input signal to an output pad in a digital circuit wherein the input signal and its inverse signal and a control signal are the digital circuit inputs, the digital circuit having supply and ground connections, said supply and ground connections connectable to supply and ground potentials respectively, said inputs having high and low logic levels, comprising:

a) gating a CMOS pull-up transistor circuit of a push-pull output driver configuration said CMOS having serially connected PMOS and NMOS transistors, a drain of said PMOS of said CMOS connected to said supply connection, said NMOS of said CMOS having a gate, said gate having a gate node;

b) gating during a first NMOS pull-down transistor of said push-pull output driver, said first NMOS pull-down transistor drain connected to a source of said NMOS of said CMOS, said first NMOS pull-down connected in parallel to said output pad;

c) turning off the PMOS and the NMOS of said CMOS when the input signal has said low logic level;

d) turning on the PMOS and the NMOS of said CMOS when the input signal has said high logic level;

e) inverting the input signal to the gate of the PMOS of said CMOS; and f) pulling said gate node to said low logic level when a switching NMOS transistor connecting said gate node to said low input signal is gated, said gate node being connected to a capacitor, said capacitor connected between said gate node and a serial node of a serially connected commonly gated MOS transistor pair, said commonly gated MOS transistor pair comprising a PMOS having a drain connectable to said supply potential and an NMOS having a source connectable to said ground potential, said PMOS and said NMOS of said commonly gated MOS transistor pair having opposite on-off states, said NMOS being on such that said serial node has said low logic level.

6. The method of claim 5, wherein said gating further comprises:

controlling said switching NMOS and said commonly gated transistor pair with a serial connection output from a serial connection of a serially connected subsequent MOS transistor pair, said subsequent MOS transistors pair comprising a PMOS having a drain which is connectable to said supply potential and an NMOS having a source which is connectable to said ground potential, said PMOS and said NMOS having opposite on-off states, said serial connection output transferred to the gate of said switching transistor through a continually gated NMOS transistor, and said serial connection output transferred directly to the gates of said commonly gated transistor pair.

7. The method of claim 6, wherein said gating further comprises:

gating the PMOS of said subsequent MOS transistor pair directly from said input signal and gating the NMOS of said subsequent MOS transistor pair from a serial output at the serial connection of a serially connected initial NMOS pair, said initial NMOS pair comprising a first initial NMOS transistor having a drain which is connectable to said supply potential and having a gate which is connected to the input signal, and a second initial NMOS transistor having a source which is connectable to said ground potential and having a gate which is connected to the inverse signal of the input signal, said first initial and second initial NMOS transistors having opposite on-off states.

8. A method of driving an input signal to an output pad in a digital circuit wherein the input signal and its inverse signal and a control signal are digital circuit inputs, the digital circuit having supply and ground connections, said supply and ground connections connectable to supply and ground potentials respectively, said inputs having high and low logic levels, comprising:

a) gating a CMOS pull-up transistor circuit of a push-pull output driver configuration said CMOS having serially connected PMOS and NMOS transistors, a drain of said PMOS of said CMOS connected to said supply connection, said NMOS of said CMOS having a gate, said gate having a gate node;

b) gating during a first NMOS pull-down transistor of said push-pull output driver, said first NMOS pull-down transistor having a drain connected to a source of said NMOS of said CMOS, said first NMOS pull-down connected in parallel to said output pad;

c) turning off the PMOS and the NMOS of said CMOS when the input signal has said low logic level;

d) turning on the PMOS and the NMOS of said CMOS when the input signal has said high logic level;

e) inverting the input signal to the gate of the PMOS of said CMOS, said inverting turning on said PMOS;

f) charging said gate node for an initial gating of the NMOS of said CMOS;

g) isolating said gate node; and h) boosting a potential of said gate node, in order to gate the NMOS of said CMOS at a higher logic level than said initial gating.

9. The method of claim 8, wherein said gating further comprises:

a) pulling said gate node to said high logic level upon an initial firing of the input signal from said low logic level to said high logic level, a switching NMOS transistor connecting said gate node to said high logic level on said input signal being gated, said gate node being connected to a capacitor, said capacitor connected beaten said gate node and a serial node at a serial connection of a serially connected commonly gated MOS transistor pair, said commonly gated MOS transistor pair comprising a PMOS having a drain connectable to said supply potential and an NMOS having a source connectable to said ground potential, said PMOS and said NMOS of said commonly gated MOS transistor pair having opposite on-off states;

b) initially charging said capacitor, said charging accomplished by said high logic level on said gate node, said serial node of said commonly gated MOS transistor pair remaining at said low logic level, said charging causing initial gating of the NMOS of said CMOS;

c) opening said switching transistor to isolate said high logic level at said gate node; and d) gating said commonly gated MOS transistor pair with said low logic level in order to turn on the PMOS of said commonly gated transistor pair causing said serial node of said commonly gated transistor pair to be pulled to said high logic level for a subsequent charging of said capacitor, said subsequent charging booting said initial charging to a higher level, the NMOS of said CMOS turning on harder.

10. The method of claim 9, wherein said gating further comprises:

controlling said switching NMOS and said commonly gated transistor pair with a serial connection output from a serial connection of a serially connected subsequent MOS transistor pair, said subsequent MOS transistors pair comprising a PMOS having a drain which is connectable to said supply potential and an NMOS having a source which is connectable to said ground potential, said PMOS and said NMOS having opposite on-off states, said serial connection output transferred to a gate of said switching transistor through a continually gated NMOS transistor, and said serial connection output transferred directly to the gates of said commonly gated transistor pair.

11. The method of claim 10, wherein said gating further comprises:

gating the PMOS of said subsequent MOS transistor pair directly from said input signal and gating the NMOS of said subsequent MOS transistor pair from a serial output at the serial connection of a serially connected initial NMOS pair, said initial NMOS pair comprising a first initial NMOS transistor having a drain which is connectable to said supply potential and having a gate which is connected to the input signal, and a second initial NMOS transistor having a source which is connectable to said ground potential and having a gate which is connected to the inverse signal of the input signal, said first initial and second initial NMOS transistors having opposite on-off states.

12. A method of driving an input signal to an output pad in a digital circuit wherein the input signal and its inverse signal and a control signal are the digital circuit inputs, the digital circuit having supply and ground connections, said supply and ground connections connectable to supply and ground potentials respectively, said inputs having high and low logic levels, comprising:
  a) gating a CMOS pull-up transistor circuit of a push-pull output driver configuration said CMOS having serially connected PMOS and NMOS transistors, a drain of said PMOS of said CMOS connected to said supply connection, said NMOS of said CMOS having a gate, said gate having a gate node;
  b) gating during a first NMOS pull-down transistor of said push-pull output driver, said first NMOS pull-down transistor having a drain connected to a source of said NMOS of said CMOS, said first NMOS pull-down connected in parallel to said output pad;
  c) turning off the PMOS and the NMOS of said CMOS when the input signal has said low logic level;
  d) turning on the PMOS and the NMOS of said CMOS when the input signal has said high logic level;
  e) pulling said gate node high when the gate node is at a high level, said pulling accomplished by a pull-up device connectable between said gate node and said supply potential.

13. A method of driving an input signal to an output pad in a digital circuit wherein the input signal and its inverse signal and a control signal are the digital circuit inputs, the digital circuit having supply and ground connections, said supply and ground connections connectable to supply and ground potentials respectively, said inputs having high and low logic levels, comprising:
  a) gating a CMOS pull-up transistor circuit of a push-pull output driver configuration said CMOS having serially connected PMOS and NMOS transistors, a drain of said PMOS of said CMOS connected to said supply connection, said NMOS of said CMOS having a gate, said gate having a gate node;
  b) gating during a first NMOS pull-down transistor of said push-pull output driver, said first NMOS pull-down transistor drain connected to a source of said NMOS of said CMOS, said first NMOS pull-down connected in parallel to said output pad;
  c) turning off the PMOS and the NMOS of said CMOS when the input signal has said low logic level;
  d) turning on the PMOS and the NMOS of said CMOS when the input signal has said high logic level;
  e) directly gating said pull-down NMOS transistor with said control signal, a high logic level control signal transferring a low logic level input signal to the output pad and a low logic level control signal transferring a high impedance to the output pad when the input signal has said low logic level and transferring said high logic level to the output pad when the input signal has said high logic level; and
  f) connecting a second NMOS pull-down transistor in parallel to said first NMOS pull-down transistor and gating said second NMOS pull-down transistor with said control signal.

14. A method of driving an input signal to an output pad in a digital circuit wherein the input signal and its inverse signal and a control signal are the digital circuit inputs, the digital circuit having supply and ground connections, said supply and ground connections connectable to supply and ground potentials respectively, said inputs having high and low logic levels, comprising:
  a) gating a CMOS pull-up transistor circuit of a push-pull output driver configuration said CMOS having serially connected PMOS and NMOS transistors, a drain of said PMOS of said CMOS connected to said supply connection, said NMOS of said CMOS having a gate, said gate having a gate node;
  b) gating during a first NMOS pull-down transistor of said push-pull output driver, said first NMOS pull-down transistor drain connected to a source of said NMOS of said CMOS, said first NMOS pull-down connected in parallel to said output pad;
  c) turning off the PMOS and the NMOS of said CMOS when the input signal has said low logic level;
  d) turning on the PMOS and the NMOS of said CMOS when the input signal has said high logic level;
  e) pulling said gate node to said low logic level when said control signal is at said low logic level, said pulling accomplished by a pull-down device connectable between said control signal and said ground potential.

15. An output driver circuit having an output node for providing an output signal, a supply node capable of electrical communication with a supply potential, a ground node capable of electrical communication with a ground potential, and digital circuit inputs comprising an input signal and a control signal, said digital circuit inputs and said output signal capable of first and second logic levels, said first and second logic levels being voltage potentials of substantially different values, wherein the output driver circuit comprises:
  a push-pull transistor configuration including:
    a) a pull-up transistor circuit interposed between said supply node and said output node, said pull-up transistor circuit comprising serially connected N-channel metal oxide semiconductor and P-channel metal oxide semiconductor transistors, said N-channel metal oxide semiconductor transistor being gated at a gate node by at least two voltage increments, said voltage increments provided by a bootstrap circuit, said bootstrap circuit accepting the input signal, said N-channel metal oxide semiconductor and said P-channel metal oxide semiconductor transistors receiving complementary gate signals resulting in duplicate switching of said N-channel metal oxide semiconductor and said P-channel metal oxide semiconductor transistors, wherein said P-channel metal oxide semiconductor transistor is gated by an inverse of the input signal, said N-channel metal oxide semiconductor transistor and said P-channel metal oxide semiconductor transistors being deactuated when the input signal has said second logic level and actuated when the input signal has said first logic a signal.
b) a pull-down transistor interposed beaten said ground connection and said output node, said pull-down transistor being gated by said control signal; and wherein
i) when said control signal has a first logic level and said input signal has said second logic level, then said output signal has said second logic level;
ii) when said control signal has a second logic level and said input signal has said high logic level then said input signal has a high logic level; and
iii) when said control signal has said second logic level a high impedance is felt at the output node when said input signal has said low logic level.

16. The output driver circuit as specified in claim 15, wherein said first logic level is a high logic level and said second logic level is a low logic level.

17. The output driver circuit as specified in claim 15, wherein a drain of said P-channel metal oxide semiconductor transistor is in electrical communication with said supply connection and a source of said N-channel metal oxide semiconductor transistor is in electrical communication with said output node.

18. The output driver circuit as specified in claim 15, wherein said pull-down transistor is an N-channel metal oxide semiconductor transistor having a drain in electrical communication with said output node and having a source in electrical communication with said ground connection.

19. The output driver circuit as specified in claim 15, further comprising a supplemental transistor connected in parallel to said pull-down transistor, thus said supplemental transistor is interposed between said output node and said ground connection, said supplemental transistor being gated by said control signal.

20. The output driver circuit as specified in claim 15, wherein said supplemental transistor is an N-channel metal oxide semiconductor transistor having a drain in electrical communication with said output node and having a source in electrical communication with said ground connection.

21. The output driver circuit as specified in claim 15, further comprising:
a) an initial NMOS transistor pair connected serially at a serial output, having a first initial NMOS transistor gated by the input signal and a second initial NMOS transistor gated by an inverse of the input signal, said first initial NMOS transistor connected to said supply node at a drain, and said second initial NMOS transistor connected to said ground node at a source, said initial NMOS transistor pair having opposite on-off states, said first logic level on said input signal resulting in said first logic level at said serial output, said second logic level on said input signal resulting in said second logic level at said serial output;
b) a subsequent MOS transistor pair having a PMOS and an NMOS serially connected at a serial connection output, said PMOS connected to said supply node at a drain and said NMOS connected to said ground node at a source, the NMOS of said subsequent MOS transistor pair directly gated by said serial output and the PMOS of said subsequent MOS transistor pair directly gated by said input signal, the PMOS and the NMOS of said subsequent transistor pair having opposite on-off states resulting in said first logic level at said serial connection output when the input signal has said second logic level and said second logic level at the serial connection output when the input signal has said first logic level;
c) a commonly gated MOS transistor pair serially connected at a serial node having a PMOS transistor connected to said supply node at a drain and an NMOS transistor connected to said ground node at a source, the PMOS and the NMOS of said commonly gated MOS transistor pair having opposite on-off states resulting in said first logic level at said serial node when said serial connection output has said second logic level and resulting in said second logic level when said serial connection output has said first logic level, said serial connection output directly connected to the gate of said commonly gated MOS transistor pair;
d) a switching NMOS transistor connected between the input signal and said gate node, said serial connection output gating said switching NMOS transistor through a continually gated NMOS transistor, said switching NMOS transistor transferring the input signal to said gate node when actuated and isolating said gate node from the input signal when deactuated; and
e) a capacitor connected between said serial node and said gate node, said capacitor receiving an initial second logic level at said gate node through said switching transistor and a subsequent second logic level at said serial node when the input signal has said second logic level, said capacitor remaining at said second logic level at said serial node and going to said first logic level at said gate node upon an initial firing of the input signal from said second logic level to said first logic level, said first logic level transferred to said gate node through said switching transistor, said capacitor charging to said first logic level, said gate node gating the NMOS of said pull-up transistor circuit, said initial firing causing said switching transistor to deactuate after a three gate time delay, said deactuating isolating said gate node from the input signal, said serial node going to said first logic level after a three gate time delay after said initial firing, said first logic level boosting said capacitor to a higher potential, the NMOS of said pull-up transistor circuit turning on harder.

22. The output driver circuit as specified in claim 15, further comprising a pull-up device for pulling said gate mode to said first logic level.

23. The output driver circuit as specified in claim 15, further comprising a pull-down device for pulling said control signal to said second logic level.

24. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:
a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said stitching states comprising a deactuated state and an actuate state, said controlling comprising actuating said NMOS transistor by applying at least two incremental voltage levels at a gate node in electrical communication with a gate terminal of said NMOS transistor, said actuating further comprising:
  i) charging said gate node to an initial voltage level for an initial gating of said NMOS transistor;
  ii) isolating said gate node; and
  iii) boosting said initial voltage to a higher voltage level in order to gate said NMOS transistor at a higher voltage level than said initial gating; and
b) controlling a pull-down transistor of said push-pull circuit configuration with said control signal such that said pull-down transistor has a switching state, said switching state comprising actuated and deactuated states.

25. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:
  a) controlling a pull-up transistor circuit of a push-pull circuit configuration with said input signal, said pull-up transistor circuit comprising serially connected PMOS and NMOS transistors, said controlling comprising actuating said NMOS transistor by applying at least two incremental voltage levels at a gate node in electrical communication with a gate terminal of said NMOS transistor, said controlling effecting duplicate switching states of said PMOS and NMOS transistors, said switching states comprising a deactuated state and an actuated state, said effecting duplicating switching states of said PMOS and NMOS transistors further comprising:
    i) driving a signal having an inverse logic state of said input signal to a gate terminal of said PMOS transistor;
    ii) pulling said gate node to one of said high and low logic states of said input signal by gating a switching NMOS transistor interposed beaten said gate node and said input terminal, a capacitor interposed between said gate node and a serial node, said serial node a serial connection of a serially connected commonly gated MOS transistor pair, said commonly gated MOS transistor pair comprising a PMOS having its drain connected to said supply node and an NMOS having its source connected to said ground node, said PMOS and said NMOS of said commonly gated MOS transistors pair having opposite on-off states; and
  b) controlling a pull-down transistor of said push-pull circuit configuration with said control signal such that said pull-down transistor has a switching state, said switching state comprising actuated and deactuated states.

26. The method of claim 25, wherein said actuating said NMOS transistor by apply at least two incremental voltage levels further comprises:
  a) initially charging said capacitor, said charging effected by a potential difference beaten said gate node and said serial node of said commonly gated MOS transistor pair, said charging causing initial gating of said NMOS transistor of said pull-up transistor circuit;
  b) deactuating said switching transistor to isolate said gate node from said input signal; and
  c) gating said commonly gated MOS transistor pair in order to actuate the PMOS transistor of said commonly gate pair, said gating causing a voltage change on said serial node of said commonly gated pair to be pulled to a level closer to said logic state of said gate node, said voltage change causing a subsequent charging of said capacitor, said subsequent charging booting said initial charging to a higher level, the NMOS of said pull-up transistor circuit turning on harder.

27. The method as specified in claim 26, wherein said gating further comprises contorting said switching transistor and said commonly gated transistor pair with a serial connection output from a serial connection of a serially connected subsequent MOS transistor pair, said subsequent MOS transistors pair comprising a serial PMOS having a drain which is connected to said supply node and a serial NMOS having a source which is connected to said ground node, said serial PMOS and said serial NMOS having opposite on-off states, said serial connection output transferred to the gate of said switching transistor through a continually gated NMOS transistor, said serial connection output transferred directly to the gates of said commonly gated transistor pair.

28. The method of claim 27, wherein said gating further comprises gating the PMOS of said subsequent MOS transistor pair directly from said input signal and gating the MOS of said subsequent MOS transistor pair from a serial output at the serial connection of a serially connected initial NMOS pair, said initial NMOS pair comprising a first initial NMOS transistor having a drain which is connected to said supply node and having a gate which is connected to said input signal, and a second initial NMOS transistor having a source which is connected to ground and having a high gate which is connected to the inverse signal of the input signal, said first initial and second initial NMOS transistors having opposite on-off states.

29. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:
  a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said switching states comprising a deactuated state and an actuated state, said controlling comprising actuating said NMOS transistor by applying at least two incremental voltage levels at a gate node in electrical communication with a gate terminal of said NMOS transistor;
  b) controlling a pull-down transistor of said push-pull circuit configuration with said control signal such that said pull-down transistor has a switching state, said switching state comprising actuated and deactuated states; and c) maintaining a potential at said gate node, said maintaining accomplished by a pull-up device connected between said gate node and said supply node.

30. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:

a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said switching states comprising a deactuated state and an actuated state, said controlling comprising actuating said NMOS transistor by applying at least two incremental voltage levels at a gate node in electrical communication with a gate terminal of said NMOS transistor;

b) controlling a pull-down transistor of said push-pull circuit configuration with said control signal such that said pull-down transistor has a switching state, said switching state comprising actuated and deactuated states;

c) directly gating said pull-down NMOS transistor with said control signal, a high control signal transferring a low input signal to the output pad and allow control signal transferring a high impedance to the output pad when the input signal is low and transferring a high to the output pad when the input signal is high; and d) connecting a second NMOS pull-down transistor in parallel to said first NMOS pull-down transistor and gating said second NMOS pull-up transistor with said control signal.

31. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:

a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said switching states comprising a deactuated state and an actuated state, said controlling comprising actuating said NMOS transistor by applying at least two incremental voltage levels at a gate node in electrical communication with a gate terminal of said NMOS transistor;

b) controlling a pull-down transistor of said push-pull circuit configuration with said control signal such that said pull-down transistor has a switching state, said switching state comprising actuated and deactuated states; and c) maintaining a potential at said gate node, said maintaining accomplished by a pull-up device electrically interposed between said control signal and ground.

32. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:

a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said switching states comprising a deactuated state and an actuated state, said controlling comprising actuating said NMOS transistor by applying at least two incremental voltage levels at a gate node in electrical communication with a gate terminal of said NMOS transistor; and b) controlling a pull-down transistor of said push-pull circuit configuration with said control signal such that said pull-down transistor has a switching state, said switching state comprising actuated and deactuated states.

33. The method as specified in claim 32 wherein said effecting duplicate switching states of said PMOS and NMOS transistors further comprising:

a) driving a signal having an inverse logic state of said input signal to a gate terminal of said PMOS transistor; and b) pulling said gate node to one of said high and low logic states of said input signal by gating a switching NMOS transistor interposed beaten said gate node and said input terminal, a capacitor interposed between said gate node and a serial node, said serial node a serial connection of a serially connected commonly gated MOS transistor pair, said commonly gated MOS transistor pair comprising a PMOS having its drain connected to said supply node and an NMOS having a source connected to said ground node, said PMOS and said NMOS of said commonly gated MOS transistors pair having opposite on-off states.

34. The method of claim 33, wherein said actuating said NMOS transistor by apply at least two incremental voltage levels further comprises:

a) initially charging said capacitor, said charging effected by a potential difference beaten said gate node and said serial node of said commonly gated MOS transistor pair, said charging causing initial gating of said NMOS transistor of said pull-up transistor circuit;

b) deactuating said switching transistor to isolate said gate node from said input signal; and c) gating said commonly gated MOS transistor pair in order to actuate the PMOS transistor of said commonly gate pair, said gating causing a voltage change on said serial node of said commonly gated pair to be pulled to a level closer to said logic state of said gate node, said voltage change causing a subsequent charging of said capacitor, said subsequent charging boosting said initial charging to a higher level, the NMOS of said pull-up transistor circuit turning on harder.

35. The method as specified in claim 34, wherein said gating further comprises controlling said switching transistor and said commonly gated transistor pair with a serial connection output from a serial connection of a serially connected subsequent MOS transistor pair, said subsequent MOS transistors pair comprising a serial PMOS having a drain which is connected to said supply node and a serial NMOS having a source which is connected to said ground node, said serial PMOS and said serial NMOS having opposite on-off states, said serial connection output transferred to the gate of said switching transistor through a continually gated NMOS transistor, said serial connection output transferred directly to the gates of said commonly gated transistor pair.

36. The method of claim 35, wherein said gating further comprises gating the PMOS of said subsequent MOS transistor pair directly from said input signal and gating the MOS of said subsequent MOS transistor pair from a serial output at the serial connection of a serially connected initial NMOS pair, said initial NMOS pair comprising a first initial NMOS transistor having a drain which is connected to said supply node and having a gate which is connected to said input signal, and a second initial NMOS transistor having a source which is connected to ground and having a high gate which is connected to the inverse signal of the input signal, said first initial and second initial NMOS transistors having opposite on-off states.

37. The method as specified in claim 32, further comprising:
   a) charging said gate node to an initial voltage level for an initial gating of said NMOS transistor;
   b) isolating said gate node; and
   c) boosting said initial voltage to a higher voltage level in order to gate said NMOS transistor at a higher voltage level than said initial gating.

38. The method as specified in claim 32, further comprising maintaining a potential at said gate node, said maintaining accomplished by a pull-up device connected between said gate node and said supply node.

39. The method as specified in claim 32, wherein said gating comprise pulling said control signal low when said control signal is at a low logic level, said pulling accomplished by a pull-down device connected between said control signal and ground.

40. A method of driving an input signal from an input terminal to an output node in a digital circuit wherein the input signal and a control signal comprise digital circuit input signals, the digital circuit connectable to a supply potential at a supply node and connectable to a ground potential at a ground node, said digital circuit input signals capable of attaining high and low logic levels, the method comprising:
   a) controlling a pull-up transistor circuit of a push-pull circuit configuration with said input signal, said pull-up transistor circuit comprising serially connected PMOS and NMOS transistors, said controlling effecting duplicate switching states of said PMOS and NMOS transistors, said switching states comprising a deactuated state and an actuated state, said controlling comprising actuating said NMOS transistor by applying at least two incremental voltage levels at a gate node in electrical communication with a gate terminal of said NMOS transistor;
   b) controlling a pull-down transistor of said push-pull circuit configuration with said control signal such that said pull-down transistor has a switching state, said switching state comprising actuated and deactuated states; and
   c) directly gating said pull-down NMOS transistor with said control signal a high control signal transferring a low input signal to the output pad and a low control signal transferring a high impedance to the output pad when the input signal is low and transferring a high to the output pad when the input signal is higher.

41. The method of claim 40, wherein said gating further comprises connecting a second NMOS pull-down transistor in parallel to said first NMOS pull-down transistor and gating said second NMOS pull-down transistor with said control signal.

* * * * *

UNITED STATES PATENT AND TRADEMARK OFFICE
CERTIFICATE OF CORRECTION

PATENT NO. : 5,128,563
DATED : July 7, 1992
INVENTOR(S) : Glen Hush; Mark R. Thomann It is certified that error appears in the above-indentified patent and that said Letters Patent is hereby corrected as shown below:

Column 2, line 37, after "Input," please insert -- signal 25 and --;

Column 2, line 43, delete "NMO" and insert -- NMOS --;

Column 2, line 64, delete "2" and insert -- 25 --;

Column 3, line 9, delete "$V_{cc}$," and insert -- $V_{cc}$ --;

Column 6, line 23, delete "transistors" and insert -- transistor --;

Column 6, line 26, delete "MPOS" and insert -- PMOS --;

Column 6, line 41, delete "connecting" and insert -- connection --;

Column 10, line 12, delete "beaten" and insert -- between --;

Column 11, line 6, delete "the" and insert -- a --;

Column 12, line 31, delete "gate node" and insert -- control signal --;

Column 13, line 2, delete "a signal" and insert -- level --;

UNITED STATES PATENT AND TRADEMARK OFFICE
CERTIFICATE OF CORRECTION

PATENT NO. : 5,128,563
DATED : July 7, 1992
INVENTOR(S) : Glen Hush; Mark R. Thomann It is certified that error appears in the above-indentified patent and that said Letters Patent is hereby corrected as shown below:

Column 13, line 3, delete "beaten" and insert -- between --;

Column 15, line 2, delete "stitching" and insert -- switching --;

Column 15, line 3, delete "actuate" and insert -- actuated --;

Column 15, line 39, delete "duplicating" and insert -- duplicate --;

Column 15, line 47, delete "beaten" and insert -- between --;

Column 15, line 57, delete "transistors" and insert -- transistor --;

Column 15, line 68, delete "beaten" and insert -- between --;

*** Column 16, line 9, delete "gate" and insert -- gated --;

Column 16, line 18, delete "contorting" and insert -- controlling --;

Column 17, line 35, delete "allow" and insert -- a low --;

UNITED STATES PATENT AND TRADEMARK OFFICE
CERTIFICATE OF CORRECTION

PATENT NO. : 5,128,563
DATED : July 7, 1992
INVENTOR(S) : Glen Hush; Mark R. Thomann It is certified that error appears in the above—identified patent and that said Letters Patent is hereby corrected as shown below:

Column 18, line 1, delete "at said gate node" and insert -- of said control signal --;

Column 18, line 38, delete "beaten" and insert -- between --;

Column 18, line 44, delete "its" and insert -- a --;

Column 18, line 47, delete "transistors" and insert -- transistor --;

Column 18, line 53, delete "beaten" and insert -- between --;

Column 20, line 32, delete "signal" and insert -- signal, --;

Column 20, line 37, delete "higher" and insert -- high --.

Signed and Sealed this

Second Day of November, 1993

*Attest:*

BRUCE LEHMAN

*Attesting Officer*   *Commissioner of Patents and Trademarks*